United States Patent

Shibata

[11] Patent Number: 6,023,076
[45] Date of Patent: Feb. 8, 2000

[54] GROUP III NITRIDE COMPOUND SEMICONDUCTOR LIGHT EMITTING DEVICE HAVING A CURRENT PATH BETWEEN ELECTRODES

[75] Inventor: Naoki Shibata, Aichi-ken, Japan

[73] Assignee: Toyoda Gosei Co., Ltd., Aichi-ken, Japan

[21] Appl. No.: 08/915,574

[22] Filed: Aug. 21, 1997

[30] Foreign Application Priority Data

Aug. 22, 1996 [JP] Japan .................................. 8-241383

[51] Int. Cl.[7] .................................................. H01L 33/00
[52] U.S. Cl. .............................. 257/94; 257/96; 257/103; 257/99
[58] Field of Search ................................ 257/94, 99, 103, 257/96

[56] References Cited

U.S. PATENT DOCUMENTS 5,369,289  11/1994  Tamaki et al. ............................ 257/103
5,652,438   7/1997  Sassa et al. .............................. 257/103

FOREIGN PATENT DOCUMENTS 0 675 552  4/1995  European Pat. Off. .
  846240   2/1996  Japan .

OTHER PUBLICATIONS

Nakamura, S., Senoh, M. and Mukai, T.; P–GaN/N–InGaN/N–GaN Double–Heterostructure Blue–Light–Emitting Diodes; Jpn. J. Appl. Phys. vol. 32, L8 (1993), pp. L8–L11.

*Primary Examiner*—Minh Loan Tran
*Attorney, Agent, or Firm*—Pillsbury Madison & Sutro LLP

[57] ABSTRACT

A double-hetero structure light emitting diode using group III nitride compound semiconductor is disclosed- The diode has a first electrode connected to a first semiconductor layer and a second electrode connected to a second semiconductor layer. In one aspect of the invention, the first electrode is also connected to the second semiconductor layer. In another aspect of the invention, a resistance is disposed between the first electrode and the second semiconductor layer. In another aspect of the invention, a diode in a reverse direction and in parallel to the light emitting diode is disposed between the first and second electrodes.

7 Claims, 8 Drawing Sheets

GROUP III NITRIDE COMPOUND SEMICONDUCTOR LIGHT EMITTING DEVICE HAVING A CURRENT PATH BETWEEN ELECTRODES

BACKGROUND OF THE INVENTION

1. Field of the Invention

The present invention relates to an improved light emitting device which comprises a group III nitride compound semiconductor satisfying the formula $Al_xIn_yGa_{1-X-Y}N$, inclusive of X=0, Y=0, X=Y=0. The light emitting semiconductor device is applicable to light-emitting diodes or laser diodes.

2. Description of Related Art.

A light emitting device using compound semiconductors includes one which emits visible light with short wavelength. In particular, the group III nitride compound semiconductors have recently attracted a large amount of attention because they have high efficiency since they are a direct transition type. Moreover, the group III nitride compound semiconductors have attracted attention because they emit a blue light which is one of three primary colors of lights.

Regarding such a light emitting device, a blue light emitting diode with a double-hetero structure is known in which a first semiconductor layer comprising an n-conductive type semiconductor, an emission layer and a second semiconductor layer comprising a p-conductive type semiconductor are layered, in order, on a sapphire substrate. In the light emitting diode, a transparent electrode made of gold is formed by evaporation on substantially the entire surface of the second semiconductor layer which is a p-conductive type. A second pad electrode made of gold is attached on the transparent electrode. A first pad electrode made of aluminum is directly attached on the first semiconductor layer.

The blue light emitting diode comprising a group III nitride compound semiconductor is sensitive to static electricity. That is, the blue light emitting diode can withstand several hundreds of volts (400~500 volts) in forward static electricity whereas it can withstand only a few dozens of volts (30~50 volts) in reverse static electricity. For example, static electricity having a voltage over what the reverse static electricity can withstand is charged on the human body. When the static electricity of the human body is applied to the blue light emitting diode in the reverse direction, damage or a breakdown may occur in the diode. The blue light emitting diode is, thus, very sensitive or difficult to handle.

SUMMARY OF THE INVENTION

The present invention is provided to solve the above problem. That is, the present invention relates to a light emitting device made of group III nitride compound semiconductor satisfying the formula $Al_xIn_yGa_{1-X-Y}N$, inclusive of X=0, Y=0, X=Y=0 which comprises: a first semiconductor layer of a first conductive type; a second semiconductor layer of a second conductive type; an emission layer formed between the first and second semiconductor layers; a first electrode connected to the first semiconductor layer and the second semiconductor layer; and a second electrode connected to the second semiconductor layer.

According to the light emitting device of the present invention, the first electrode is connected to the first and second semiconductor layer. The device, therefore, can be constructed so that a main part of a current applied to the light emitting device flows preferentially from the first electrode to the second semiconductor layer whereas only a small part of the applied current flows inside the light emitting device. The light emitting device thereby suffers no damage, and thus, the light emitting device of the present invention is convenient to handle.

In another aspect of the present invention, a resistance is formed between the first electrode and the second semiconductor layer. The resistance is higher than a resistance of the light emitting device in the forward direction and is lower than a resistance of the device in the reverse direction. Consequently, when a voltage is applied to the light emitting device in the forward direction, the current preferentially flows through the device. When the voltage is applied to the light emitting device in the reverse direction, the current preferentially flows between the first electrode and the second semiconductor layer. Therefore, the light emitting device of the present invention suffers no damage when the static voltage in the reverse direction is applied thereto. Thus, the light emitting device of the present invention is convenient to handle.

In yet another aspect of the present invention, a diode in the reverse direction and in parallel to the light emitting device is disposed between the first and second electrodes.

According to the above aspect of the invention, when a voltage is applied to the light emitting device in the forward direction, the current preferentially flows through the device. When the voltage is applied to the light emitting device in the reverse direction, the current preferentially flows between the first electrode and the second electrode. The light emitting device of the present invention suffers no damage when the static voltage in the reverse direction is applied thereto. Thus, the light emitting device of the present invention is convenient to handle.

BRIEF DESCRIPTION OF THE DRAWINGS

These and other objects and technical advantages of the present invention will be readily apparent from the following description of the preferred exemplary embodiments of the invention in conjunction with the accompanying drawings, in which.

DETAILED DESCRIPTION OF THE PREFERRED EMBODIMENT

The present invention is now described in detail with reference to the attached drawings.

Figure 1:
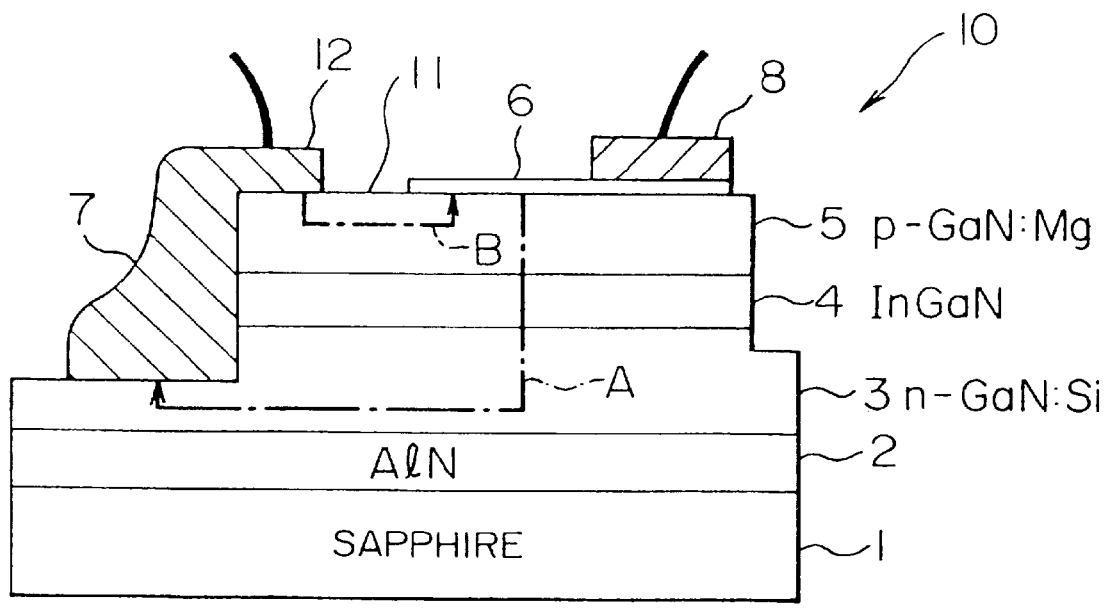
FIG. 1 shows a light emitting diode of an embodiment of the present invention, and is a sectional view indicated by line I—I in FIG. 2.
Figure 2:
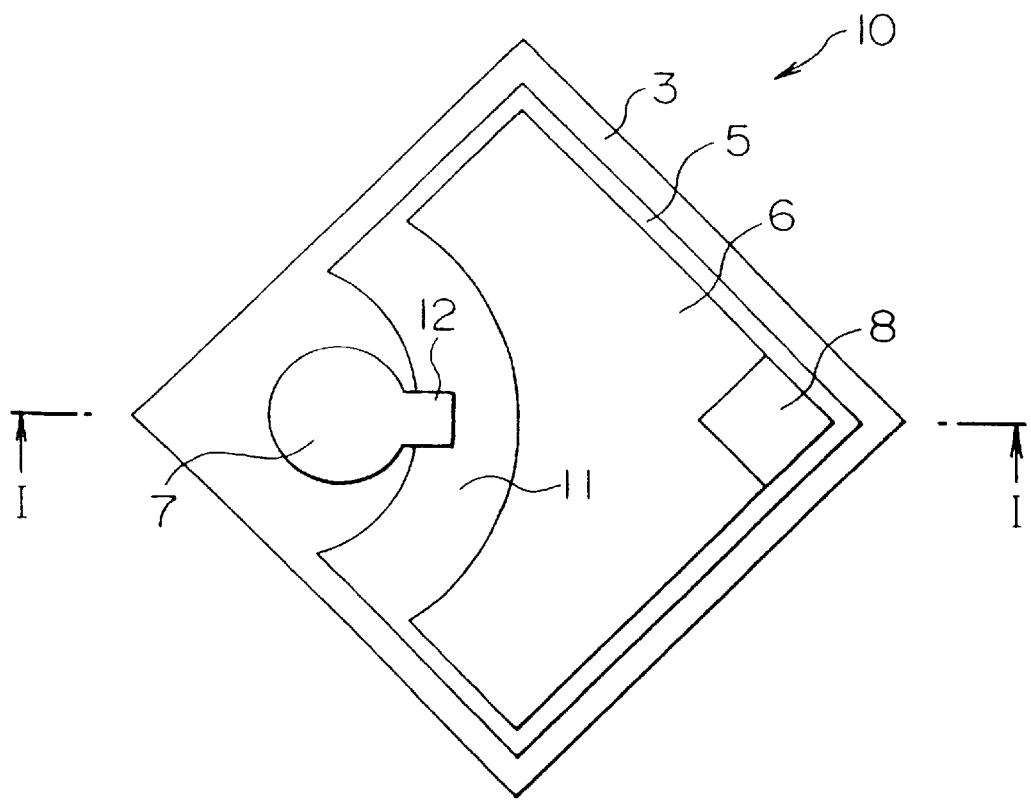
FIG. 2 is a plane view of the light emitting diode.

FIG. 1 is a sectional view showing a light emitting diode 10 of an embodiment of the present invention. The light emitting diode 10 includes a buffer layer 2 which is made of AlN and grown on a sapphire substrate 1. A first semiconductor layer (a first clad layer) 3 made of n-GaN is formed on the buffer layer 2. A light emitting layer 4 made of InGaN is formed on the first semiconductor layer 3. A second semiconductor layer (second clad layer) 5 made of magnesium doped p-GaN is formed on the light emitting layer 4. An electrode 6 which is made of gold and allows light to pass therethrough is formed by evaporation on the second semiconductor layer 5. An electrode 8 is also formed on the electrode 6 by evaporation. The second semiconductor layer 5, as shown in FIG. 2, includes a bare region 11 not covered by the electrode 6. An electrode 7 of the first semiconductor layer 3 extends upward to contact the bare region 11.

The first semiconductor layer 3 of n-conductive type is formed on the sapphire substrate 1 with the buffer layer 2 made of AlN interposed therebetween. The first semiconductor layer 3 may be constructed as a double layer which comprises an n-layer poor in electron concentration on the light emitting layer side and an n$^+$-layer rich in electron concentration on the buffer layer side.

The light emitting layer 4 is not limited to the double-hetero junction type shown in FIG. 1. A single-hetero junction type and a supper lattice structure type can be substituted for the light emitting layer 4.

An $Al_A In_B Ga_{1-A-B}N$ (where A=0, B=0, A=B=0 are included) layer having a wide band gap in which acceptors such as magnesium are doped can be interposed between the light emitting layer 4 and the second semiconductor layer 5 of p-conductive type. The $Al_A In_B Ga_{1-A-B}N$ layer prevents electrons injected in the light emitting layer 4 from diffusing into the second semiconductor layer 5.

The second semiconductor layer 5 may be constructed as a double layer which comprises a p-layer poor with low hall concentration located on the light emitting layer side and a p$^+$-layer with high hall concentration located on the electrode side.

The second semiconductor layer 5 of magnesium doped p-conductive type has a high resistance. Therefore, if a current is injected into one end of the second semiconductor layer 5 only from the electrode 8, the current density in the active layer 4 may be not uniform in the entire region thereof. The thin electrode 6, which allows rays to pass therethrough and covers substantially the entire surface of the second semiconductor layer 5, is formed between the electrode 8 and the second semiconductor layer 5.

The electrode 8 and thin electrode 6 may be made of Au, Pt, Pd, Ni, Co or an alloy including at least one of these metals. The metal or the alloy is subjected to evaporation to form the electrodes 6 and 8 on the second semiconductor layer 5.

The electrode 7 connected to the first semiconductor layer 3 of n-conductive type comprises Al, Ti, Ta, V, Nb, Cr, Zr, Mo or alloys including at least one of these metals. The electrode 7 has a connecting portion 12. The connecting portion 12 expands upwardly from the electrode 7 and is connected to the bare region 11 of the second semiconductor layer 5. It is desirable to form a gap of 5 to 100 μm or more between the connecting portion 12 and the thin electrode 6. Where the gap is less than 5 μm, a current may flow from the thin electrode 6 to the connecting portion 12. That is, current may flow to the first electrode 7 through the second semiconductor layer 5 when a bias in the forward direction is applied to the device 10. Where the gap is greater than 100 μm, a resistance between the connecting portion 12 and the thin electrode 6 is higher than the resistance of the device 10 itself when a voltage is applied to the device in the reverse direction. The current then preferentially flows through the device 10 resulting in a breakdown of the device 10.

The connecting portion 12 functions as an electrical connection between the second semiconductor layer 5 and the first electrode 7. Another member which is not integral to the first electrode 7 (for example, a wire) can be substituted for the connecting portion 12. It is unnecessary to make the connecting portion 12 go around the top surface of the second semiconductor layer 5. It is sufficient to make the connecting portion 12 contact a side surface of the second semiconductor layer 5.

The electrode 7 having the connecting portion 12 is formed on the first and second semiconductor layers 3 and 5 by evaporation using a photolithography process.

Where the connecting portion 12 is connected to the second semiconductor layer 5 of p-conductive type and the ideal connection therebetween is formed, a Schottky connection is made between the connecting portion 12 and the second semiconductor layer 5. When Al is used for making the electrode, the forward direction is defined from the second semiconductor layer 5 to the connecting portion 12 so that no current may flow from the connecting portion 12 to the second semiconductor layer 5.

According to the present invention, a current of 10 μA or more began to flow from the electrode 7 to the electrode 8 through the second semiconductor layer 5 while applying a bias voltage of 0.1~3.5 volts after the first electrode 7 including the connecting portion 12 is subjected to thermal treatment under 400~700 °C. for 30 seconds 30 minutes. It is supposed is that the connection between the metal of the connecting portion 12 and the second semiconductor layer 5 is not ideal. A voltage at which a current begins to flow from the first electrode 7 to second electrode 8 is lower than the static electricity proof in the reverse direction of the light emitting device 10.

The imperfect Schottky junction, in another aspect, functions as if a resistance between the connecting portion 12 and the second semiconductor layer 5 was made.

In FIG. 1, a current flows along a broken line A as a voltage is applied to the light emitting device 10 in the forward direction, and thereby the thin LED emits the light from the light emitting layer 4. At the same time, a small amount of current flows from the thin electrode 6 to the connecting portion 12 due to the resistance of the second semiconductor layer 5. The second semiconductor layer 5, with a high resistance, also improves the static electricity proofness of the device 10.

However, a current flows from the connecting portion 12 via the second semiconductor layer 5 to the second electrode 8 as shown with a broken line B when a voltage is applied to the light emitting device 10 in the reverse direction. Thus, a small current flows inside the device 10.

Figure 3:
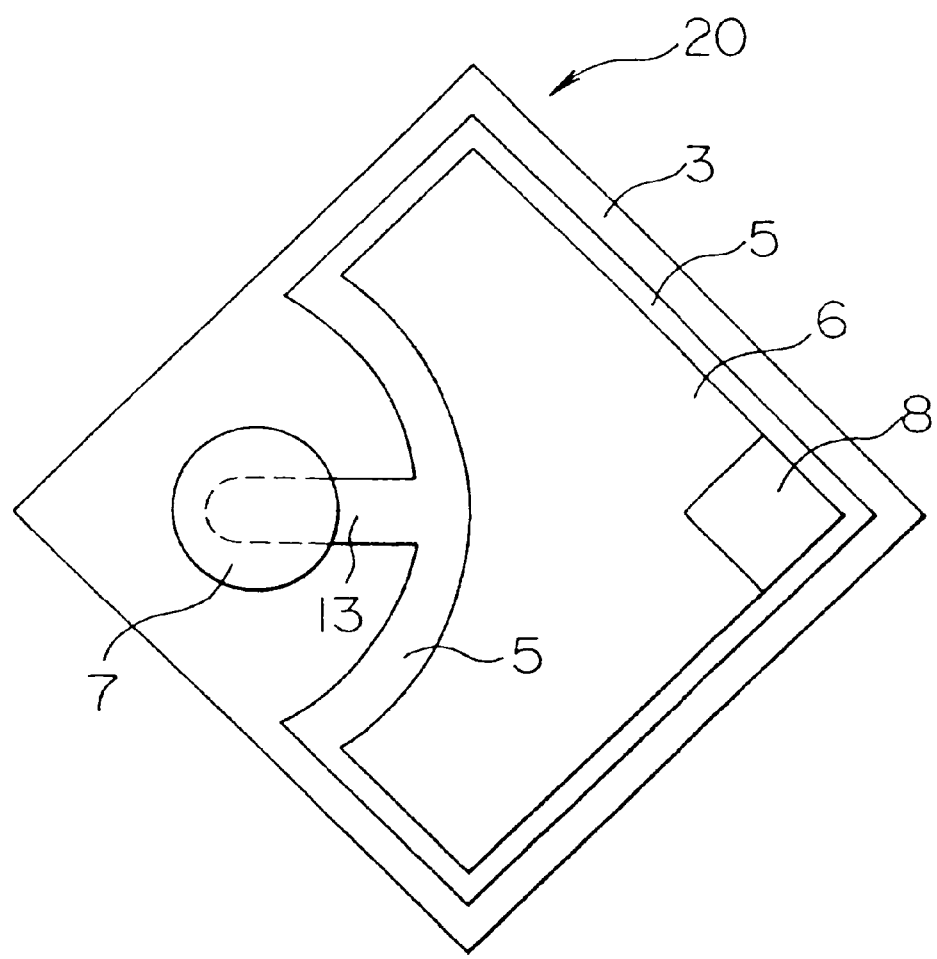
FIG. 3 is a plane view of a light emitting diode of another embodiment of the present invention.

FIG. 3 is a plane view showing a light emitting device 20 of another embodiment of the present invention. In FIG. 3, corresponding numerals are used to refer to corresponding elements in FIG. 2 to obviate repeated explanation.

The second semiconductor layer 5 of p-conductive type has a connecting portion 13 in the light emitting device 20. The connecting portion 13 extends from the second semiconductor layer 5 to a region, in which the first electrode 7 should be formed, on the first semiconductor layer 3 of n-conductive type.

The connecting portion 13 is formed at the same time as the second semiconductor layer 5 after etching the light emitting layer 4 and the first semiconductor layer 3 in a well-known process. The conditions of the thermal treatment to the connecting portion 13 is the same as that of the thermal treatment to the above-mentioned light emitting device 10. The performance of the light emitting device 20 is the same as that of the light emitting device 10 shown in FIG. 2.

Figure 4:
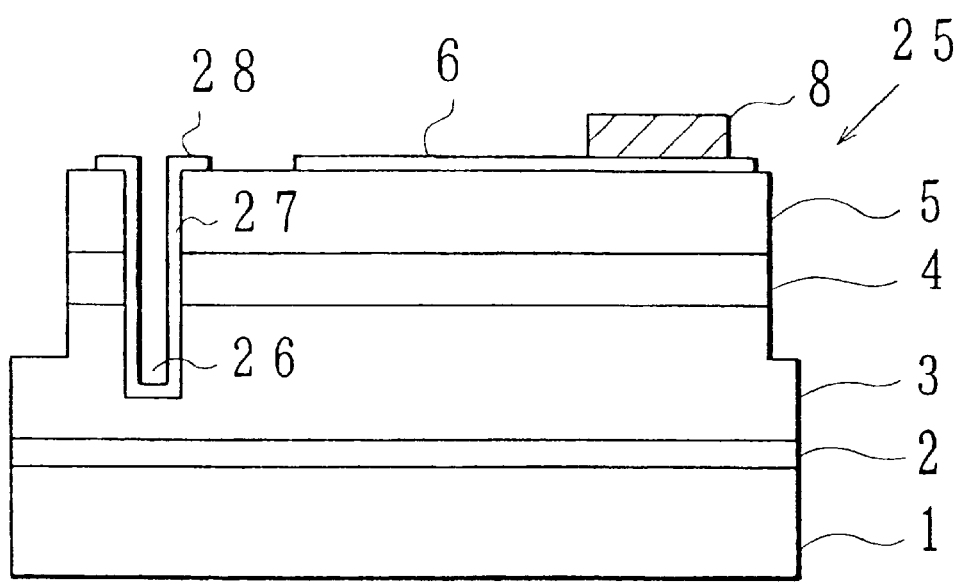
FIG. 4 shows a light emitting diode of another embodiment of the present invention, and is a sectional view indicated by line IV—IV in FIG. 5.
Figure 5:
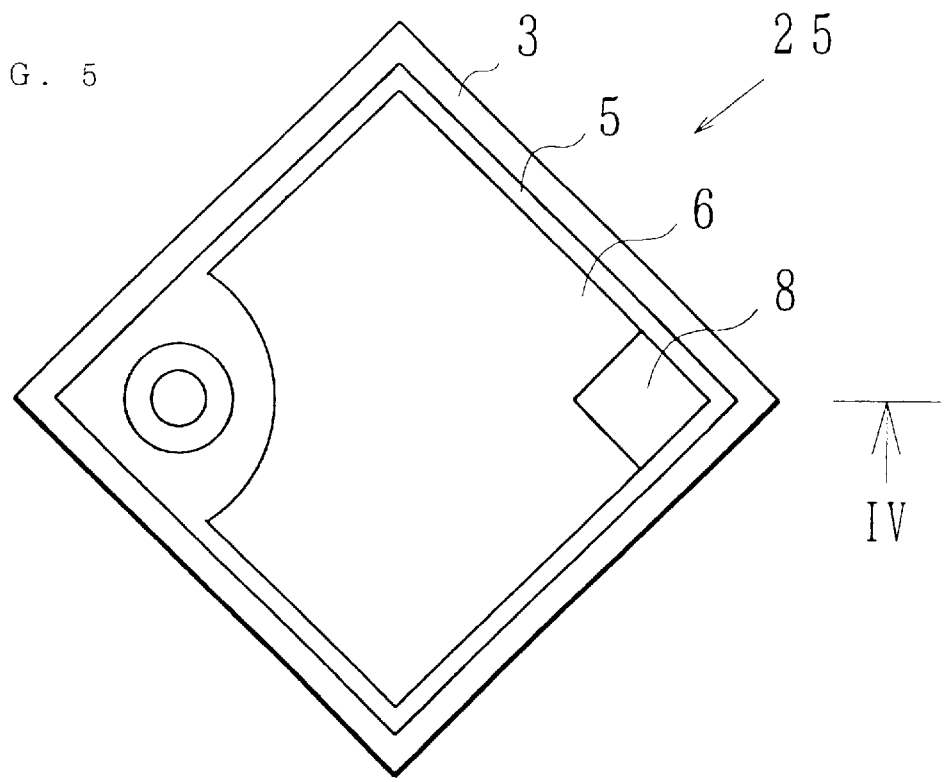
FIG. 5 is a plane view of the light emitting diode.

FIG. 4 is a sectional view showing a light emitting device 25 of another embodiment of the present invention. FIG. 5 is a plane view of the device 25. In FIGS. 4 and 5, corresponding numerals are used to refer to corresponding elements in FIGS. 1 and 2 to obviate repeated explanation.

A hole 26 is etched through the second semiconductor layer 5 of p-conductive type, the light emitting layer 4 and the first semiconductor layer 3 of n-conductive type in the light emitting device 25. An electrode 27 having a cylindrical shape with a bottom is formed in close connection to a wall of the hole 26. The electrode 27 has a flange 28 at the top end. A gap between a periphery of the flange 28 and the thin electrode 6 is 5~100 µm like that of the light emitting device 10 shown in FIGS. 1 and 2.

The material of the electrode 27 is the same as the above-mentioned electrode 7. The electrode 27 is formed by evaporation after etching the second semiconductor layer 5, the light emitting layer 4 and the first semiconductor layer 3 in a well-know process. The conditions of the following thermal treatment are the same as that of the above-mentioned light emitting device 10. The performance of the light emitting device 25 is the same as that of the light emitting device 10.

Figure 6:
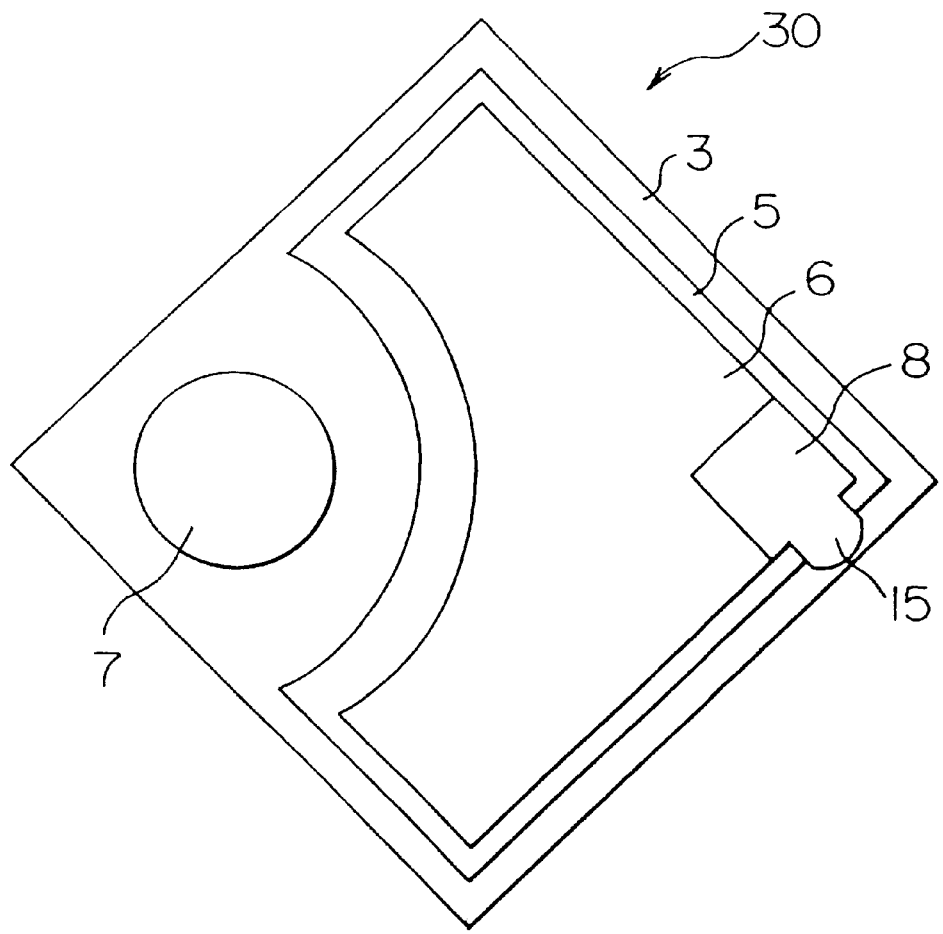
FIG. 6 is a plane view of a light emitting diode of another embodiment of the present invention.

FIG. 6 is a plane view of a light emitting device 30 of another embodiment of the present invention. In FIG. 6, corresponding numerals are used to refer to corresponding elements in FIG. 2 to obviate repeated explanation. The light emitting device 30 includes the second electrode 8 having a connecting portion 15. The connecting portion 15 is connected to the first semiconductor layer 3.

Where the connecting portion 15 of the electrode 8 is made of gold and connected to the first semiconductor layer 3 of n-conductive type and the ideal connection is performed therebetween, a Schottky junction is made between the junction portion 15 and the first semiconductor layer 3. The forward direction is defined from the junction portion 15 to the first semiconductor layer 3 so that no current may flow from the first semiconductor layer 3 to the junction portion 15.

According to the present invention, a resistance appeared across a path between the connecting portion 15 and the first semiconductor layer 3 after the second electrode 8, including the junction portion 15, is subjected to thermal treatment under 400~700° C. for 30 seconds 30 minutes. A current of 10 µA or more began to flow from the first semiconductor layer 3 to the junction portion 15 while applying a bias of 0.1~3.5 voltages. The supposed reason is that the ideal connection between the metal of junction portion 15 and the first semiconductor layer 3 is not formed, and thus, an imperfect Schottky junction is made.

The imperfect Schottky junction, in another aspect, functions as if a resistance was made between the junction portion 15 and the first semiconductor layer 3. The resistance is higher than that of the light emitting device in the forward direction and lower than that in the reverse direction.

According to the present invention, it is desirable to have the resistance between the junction portion 15 and the first semiconductor layer 3 be 10~1,000 times higher than the resistance of the semiconductor device in the forward direction, wherein 100 times higher is more desirable. In the more desirable case, 1/100 of the applied current flows between the electrode 8 and the first semiconductor layer 3 while the light emitting device 30 is biased in the forward direction.

When a voltage is applied to the light emitting device 30 in the forward direction, a current flows inside of the device 30 to the light emitting layer to emit the light. A current from the second electrode 8, i.e. the junction portion 15 to the first semiconductor layer 3, is much smaller than the current inside the light emitting device due to the imperfect Schottky junction, in applying the forward bias. Thus, the device suffers no influence in its light emitting efficiency.

However, when a voltage is applied to the light emitting device 30 in the reverse direction, a current preferentially flows along a path between the first semiconductor layer 3 and the junction portion 15 which has a resistance which is lower than that of the device 30 in the reverse direction. Therefore, a small current inside the device 30 prevents breakdown of the device 30.

Figure 7:
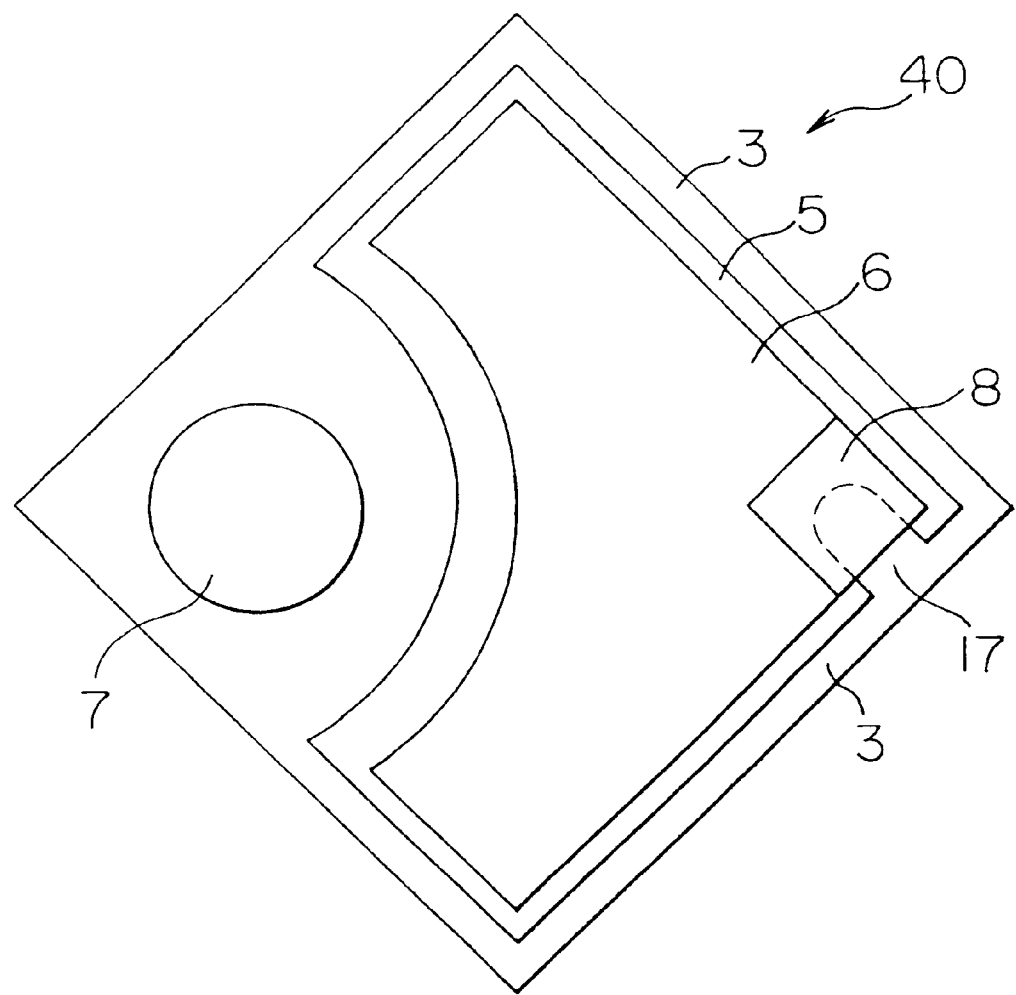
FIG. 7 is a plane view of a light emitting diode of another embodiment of the present invention.

FIG. 7 is a plane view showing a light emitting device 40 of another embodiment of the present invention. In FIG. 7, corresponding numerals are used to refer to corresponding elements in FIG. 6 to obviate repeated explanation. The first semiconductor layer 3 of n-conductive type has a junction portion 17 in the light emitting device 40. The junction portion 17 extends upwardly from the first semiconductor layer 3 to reach a region of the second semiconductor layer 5 of p-conductive type. The first electrode 8 is formed on the second semiconductor layer 5.

The junction portion 17 is formed by utilizing a patterned mask followed by etching the light emitting layer 4 and the second semiconductor layer 3 in a well-known process. The conditions of the thermal treatment to the junction portion 17 are the same as that of the above-mentioned light emitting device 30. The performance of the light emitting device 40 is the same as that of the light emitting device 30.

Figure 8:
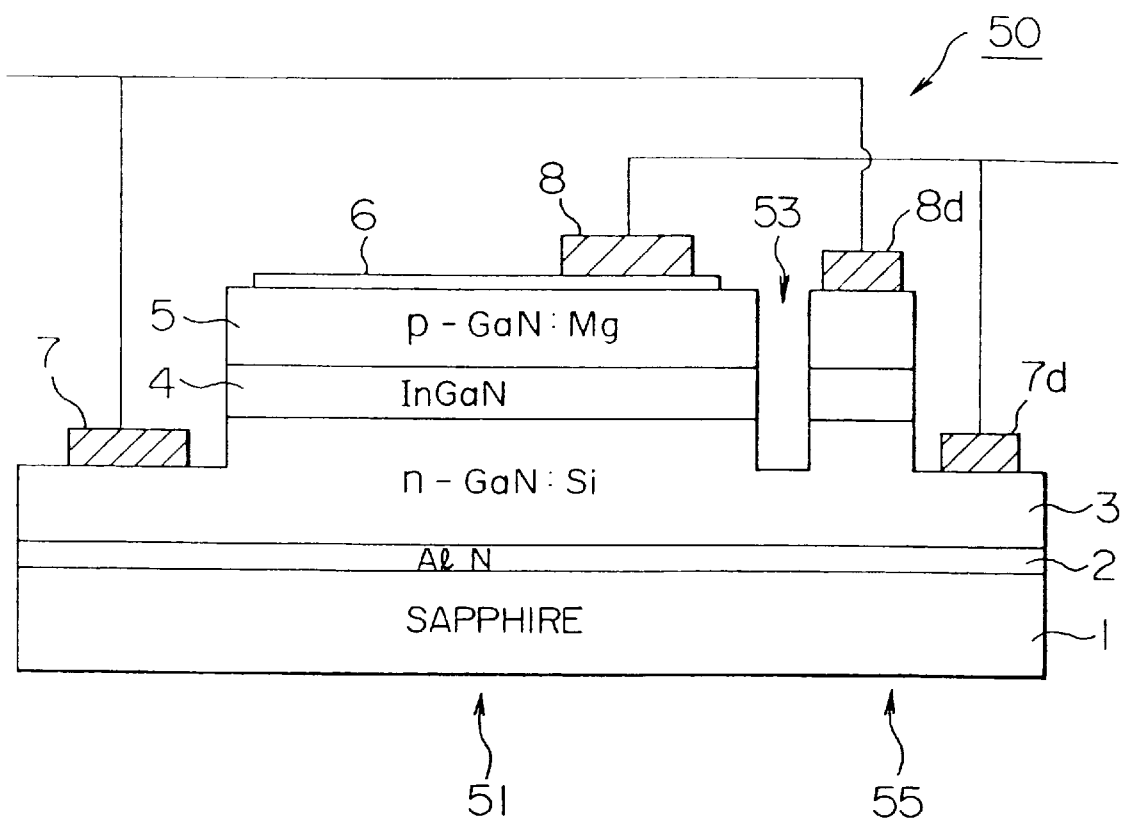
FIG. 8 is a plane view of a light emitting diode of another embodiment of the present invention.

FIG. 8 is a sectional view of a light emitting device 50 of another embodiment of the present invention. In FIG. 8, corresponding numerals are used to refer to corresponding elements in FIG. 1 to obviate repeated explanation. The semiconductor light emitting device 50 is constructed so that a device body 51 having a conventional structure and a diode portion 55 are connected in parallel by interposing a recess 53 for isolation therebetween.

The diode portion 55 comprises the first semiconductor layer 3 of n-conductive type, the light emitting layer 4 and the second semiconductor layer 5 of p-conductive type. Electrodes 7d and 8d are connected to the first and second semiconductor layers 3 and 5, respectively, in the same manner as the first and second electrodes 7 and 8. The first electrode 7 of the device body 51 is connected to the upper electrode 8d of the diode portion 55. Similarly, the second electrode 8 of the device body 51 is connected to the lower electrode 7d of the diode portion 55 Thus, the diode portion 55 is connected to the device body 51 in parallel and in a different direction.

The light emitting layer 4 can be eliminated from the diode portion 55. However, it is preferable to put the light emitting layer 4 aside the diode portion 55 in view of forming the diode portion 55 and the device body 51 in parallel or at a time.

The recess 53 electronically isolates the device body 51 from the diode portion 55. The recess 53 is formed by conventional dry etching. An example of such a method is described in JP-A 8-46240, which is incorporated herein by reference.

When a forward voltage is applied to the device body 51 of the light emitting device 50, a current preferentially flows inside the device body 51 to cause emission from the light emitting layer 4. No current flows inside the diode portion 55 while applying the forward voltage to the device body 51 because the voltage is applied to the diode portion 55 in the reverse direction.

However, when the reverse voltage is applied to the device body 51, the diode portion 55 is forward biased. Thus, the current preferentially flows inside the diode portion 55. Therefore, a small current flows inside the device body 51 to prevent breakdown of the light emitting device 50.

The fabrication method of the light emitting diode 10 in FIG. 1 and specifications of the respective layers therein will be described hereinafter.

The group III nitride compound semiconductor layer is fabricated by a metal organic vapor phase epitaxy technique (hereinafter referred to MOVPE). In the method, an ammonium gas and an alkyl—Group III element—compound such as trimethyl gallium (hereinafter referred to TMG), trimethyl aluminum (hereinafter referred to TMA) and trimethyl indium (hereinafter referred to TMI) are all provided on a substrate heated at a preferable temperature to execute heat decomposition reaction. Accordingly, a crystal is grown on the substrate.

First, a monocrystal sapphire substrate 1, in which [a] surface is a main surface, having been subjected to cleaning by an organic solvent. The thermal treatment is prepared and set on a susceptor disposed within a vapor reaction chamber (not shown). Next, while passing $N_2$ to the reaction chamber at a flow rate of 2 liter/minute under a normal pressure, the sapphire substrate 1 is subjected to vapor phase etching at 1100° C.

Thereafter, the temperature is lowered to 400° C., followed by feeding $N_2$ into the chamber at 20 liter/minute, $NH_3$ at 10 liter/minute and TMA at a rate of $1.8 \times 10^{-5}$ mol/minute to form an AlN buffer layer 2 with a thickness of about 50 nm. Next, while keeping the sapphire substrate 1 at a temperature of 1,150° C., $1.12 \times 10^{-4}$ mol/minute of TMG and 10 liter/minute of $NH_3$ are fed into the chamber to form the first semiconductor layer 3 of silicon doped GaN having an electron concentration of $2 \times 10^{18}/cm^3$ and a thickness of about 2200 nm.

Thereafter, while keeping the sapphire substrate 1 at a temperature 850° C., 20 liter/minute of $N_2$, 10 liter/minute of $NH_3$, $1.53 \times 10^{-4}$ mol/minute of TMG and $0.02 \times 10^{-4}$ mol/minute of TMI are fed into the reaction chamber to form the light emitting layer 4 of $In_{0.05}Ga_{0.95}N$ with a thickness of about 500 nm.

While keeping the sapphire substrate 1 at a temperature 850° C., 20 liter/minute of $N_2$, 10 liter/minute of $NH_3$, $1.12 \times 10^{-4}$ mol/minute of TMG and $2 \times 10^{-4}$ mol/minute of $CP_2Mg$ are fed into the reaction chamber to form the second semiconductor layer 5 of magnesium doped GaN with a thickness of about 1000 nm. A magnesium concentration in the second semiconductor layer 5 is $1 \times 10^{20}/cm^3$. At this point in time, the second semiconductor layer 5 is semi-insulator with high resistance.

Thereafter, the second semiconductor layer 5 is evenly irradiated with electron beams by an electron irradiation apparatus. The specifications of the electron beam irradiation include an acceleration voltage of 10 kV, a sample current of 1 $\mu$A, a beam transfer rate of 0.2 mm/sec, a beam diameter of 60 $\mu$m and a degree of vacuum of $5.0 \times 10^{-5}$ Torr. Such an electron beam irradiation causes the second semiconductor layer 5 to be a desirable p-conductive type. At this point, the resistance of the second semiconductor layer is about 1~30 $\Omega$ cm.

A semiconductor wafer thus formed is subjected to a conventional etching process to obtain the semiconductor structure shown in FIG. 1. The first pad electrode 7 is formed by evaporation. The thin electrode 6 made of gold is formed by evaporation on the second semiconductor layer 5 followed by the formation of the second pad electrode 8.

Thus, the semiconductor wafer obtained is cut and divided into respective devices which emit the light.

Thus, the obtained LED suffered no damage or breakdown while applying a voltage of 500 volts in the reverse direction. The LED emitted the light while applying a bias of 3.5 volts and 20 mA in the forward direction.

As described above, according to one aspect of the light emitting device of the present invention, the first electrode contacts the second semiconductor layer. Therefore, when a high voltage is applied to the light emitting device in the reverse direction, the current preferentially flows from the first electrode to the second semiconductor layer whereas a small amount of current flows inside the light emitting device. Thus, the light emitting device suffers no damage or breakdown so that the light emitting device is easy or convenient to handle.

According to the other aspect of the invention, a resistance is formed between the first electrode and the second semiconductor layer. The resistance is higher than a forward resistance of the light emitting device and is lower than a reverse resistance of the device. Therefore, when a voltage is applied to the light emitting device in a forward direction, the current preferentially flows inside the light emitting device. When a voltage is applied to the light emitting device in the reverse direction, the current preferentially flows between the first electrode and the second semiconductor layer. Therefore, the light emitting device of the present invention suffers no damage when static electricity is applied thereto in the reverse direction. Hence, the light emitting device of the present invention is easy or convenient to handle.

According to the other aspect of the invention, a diode in the reverse direction and in parallel to the light emitting device is disposed between the first electrode and the second electrode. Therefore, when a voltage is applied to the light emitting device in a forward direction, the current preferentially flows inside the light emitting device. When a voltage is applied to the light emitting device in the reverse direction, the current preferentially flows between the first electrode and the second electrode. Therefore, the light emitting device of the present invention suffers no damage when static electricity is applied thereto in the reverse direction. Hence, the light emitting device of the present invention is easy or convenient to handle.

The present invention has been described in detail, it should be understood that various changes, substitutions and alternations can be made hereto without departing from the spirit and scope of the present invention as defined by the appended claims.

What is claimed is:

1. A light emitting device comprising:
    a first semiconductor layer of a first conductive type wherein said first semiconductor layer comprises a group III nitride compound semiconductor satisfying the formula $Al_{X1}In_{Y1}Ga_{1-X1-Y1}N$ inclusive of X1=0, Y1=0 and X1=Y1=0;
    a second semiconductor layer of a second conductive type, wherein said second semiconductor layer comprises a group III nitride compound semiconductor satisfying the formula $Al_{X2}In_{Y2}Ga_{1-X2-Y2}N$, inclusive of X2=0, Y2=0 and X2=Y2=0;

a light emitting layer formed between said first and second semiconductor layers;

a first electrode connected to said first semiconductor layer and said second semiconductor layer; and a second electrode connected to said second semiconductor layer;

wherein a current biased in a reverse direction of said light emitting device flows from the first electrode to the second electrode substantially only via the second semiconductor layer; and said first semiconductor layer comprises n-type semiconductor and said second semiconductor layer comprises a p-type conductor.

2. A light emitting device according to claim 2, wherein said first semiconductor layer includes a junction portion extending from said first semiconductor layer to said second semiconductor layer.

3. A light emitting device comprising:

a first semiconductor layer of a first conductive type, wherein said first semiconductor layer comprises a group III nitride compound semiconductor satisfying the formula $Al_{X1}In_{Y1}Ga_{1-X1-Y1}N$, inclusive of X1=0, Y1=0 and X1=Y1=0;

second semiconductor layer comprises a group III nitride compound semiconductor satisfying the formula $Al_{X2}In_{Y2}Ga_{1-X2-Y2}N$, inclusive of X2=0, Y2=0 and X2=Y2=0;

a light emitting layer formed between said first and second semiconductor layers;

a first electrode connected to said first semiconductor layer;

a second electrode connected to said second semiconductor layer; and a current path disposed between said first electrode and said second semiconductor layer, said current path having an electric resistance because of a contact resistance between said first electrode and said second semiconductor layer;

wherein a current biased in a reverse direction of said light emitting device flows from the first electrode to the second electrode substantially only via the second semiconductor layer, and said first semiconductor layer comprises an n-type semiconductor and said second semiconductor layer comprises a p-type semiconductor.

4. A light emitting device according to claim 3, wherein said first semiconductor layer includes a junction portion extending from said first semiconductor layer to said second semiconductor layer.

5. A light emitting device comprising:

a device body including:
a first semiconductor layer of a first conductive type, wherein said first semiconductor layer comprises a group III nitride compound semiconductor satisfying the formula $Al_{X1}In_{Y1}Ga_{1-X1-Y1}N$, inclusive of X1=0, Y1=0 and X1=Y1=0;

a second semiconductor layer of a second conductive type, wherein said second semiconductor layer comprises a group III nitride compound semiconductor satisfying the formula $Al_{X2}In_{Y2}Ga_{1-X2-Y2}N$, inclusive of X2=0, Y2=0 and X2=Y2=0;

a light emitting layer formed between said first and second semiconductor layers;

a first electrode connected to said first semiconductor layer; and a second electrode connected to said second semiconductor layer; and a diode disposed between said first and second electrodes in a reverse direction and in parallel to said device body.

6. A light emitting device comprising:

a first semiconductor layer of a first conductive type, wherein said first semiconductor layer comprises a group III nitride compound semiconductor satisfying the formula $Al_{X1}In_{Y1}Ga_{1-X1-Y1}N$, inclusive of X1=0, Y1=0 and X1=Y1=0;

a second semiconductor layer of a second conductive type, wherein said second semiconductor layer comprises a group III nitride compound semiconductor satisfying the formula $Al_{X2}In_{Y2}Ga_{1-X2-Y2}N$, inclusive of X2=0, Y2=0 and X2=Y2=0;

a light emitting layer formed between said first and second semiconductor layers;

a first electrode connected to said first semiconductor layer and said second semiconductor layer; and a second electrode connected to said second semiconductor layer;

wherein a current biased in a reverse direction of said light emitting device flows from the first electrode to the second electrode substantially only via the second semiconductor layer; and said second electrode includes a connecting portion connected to said first semiconductor layer so that a Schottky junction is formed between the connecting portion and said first semiconductor layer.

7. A light emitting device comprising:

a first semiconductor layer of a first conductive type, wherein said first semiconductor layer comprises a group III nitride compound semiconductor satisfying the formula $Al_{X1}In_{Y1}Ga_{1-X1-Y1}N$, inclusive of X1=0, Y1=0 and X1=Y1=0;

second semiconductor layer comprises a group III nitride compound semiconductor satisfying the formula $Al_{X2}In_{Y2}Ga_{1-X2-Y2}N$, inclusive of X2=0, Y2=0 and X2=Y2=0;

a light emitting layer formed between said first and second semiconductor layers;

a first electrode connected to said first semiconductor layer;

a second electrode connected to said second semiconductor layer; and a current path disposed between said first electrode and said second semiconductor layer, said current path having an electric resistance because of a contact resistance between said first electrode and said second semiconductor layer;

wherein a current biased in a reverse direction of said light emitting device flows from the first electrode to the second electrode substantially only via the second semiconductor layer; and said second electrode includes a connecting portion connected to said first semiconductor layer so that a Schottky junction is formed between the connecting portion and said first semiconductor layer.

* * * * *